United States Patent [19]

Walker et al.

[11] Patent Number: 4,477,827

[45] Date of Patent: Oct. 16, 1984

[54] LEAD FRAME FOR LEADED SEMICONDUCTOR CHIP CARRIERS

[75] Inventors: John C. Walker, Kanata; Manfred Thumm, Nepean, both of Canada

[73] Assignee: Northern Telecom Limited, Montreal, Canada

[21] Appl. No.: 526,600

[22] Filed: Aug. 26, 1983

Related U.S. Application Data

[63] Continuation-in-part of Ser. No. 230,758, Feb. 2, 1981, abandoned.

[51] Int. Cl.³ ............... H01L 23/48; H01L 29/44; H01L 23/28
[52] U.S. Cl. .................. 357/70; 357/68; 357/72
[58] Field of Search ............. 357/68, 70, 72; 174/52 PE

[56] References Cited

U.S. PATENT DOCUMENTS 4,214,364  7/1980  St. Louis et al. ........... 174/52 PE
4,301,464  11/1981  Otsuki et al. ............. 357/68 X Primary Examiner—Andrew J. James
Assistant Examiner—John Lamont
Attorney, Agent, or Firm—Sidney T. Jelly

[57] ABSTRACT

A lead frame with parallel side members and parallel transverse members defining chip receiving areas along the frame, has a chip pad at each area. A support lead extends from each corner of the chip pad to corresponding conjunctions of side and transverse members. A U-shaped support bar extends between each adjacent pair of support leads, each support bar including spaced parallel leg portions connected at inner ends to the support leads and at the outer ends by a lead support portion. Leads extend from each lead support portion towards the chip pad. By this means the chip can be assembled to the pad and wire bonding between chip and leads carried out and the leads can be preformed or not, as desired, prior to encapsulation. After encapsulation, the lead support portions can be trimmed off but the encapsulated device is still held in the lead frame but the leads are electrically isolated from each other. Testing can be carried out while devices are still in the lead frame.

11 Claims, 11 Drawing Figures

LEAD FRAME FOR LEADED SEMICONDUCTOR CHIP CARRIERS

This application is a Continuation-in-Part of application Ser. No. 230,758, filed Feb. 2, 1981, now abandoned.

This invention relates to a lead frame for leaded semiconductor chip carriers.

In the manufacture of semiconductor chips, the chips are mounted on a die pad, and connections made between contact areas on the chip and leads which will eventually be used to connect the final device into a circuit, as by attachment to a printed circuit board (PCB). The chip is packaged, in one of a variety of ways, for example hermetic and non-hermetic encapsulation.

With the extremely large numbers being produced and the need to reduce labour content and to maintain high standards of accuracy and minimal rejection rates, it is favourable to handle assembly in strip form, a lead frame having a number of chip positions, with leads extending from the frame towards a chip mounting position. One such form of lead frame is illustrated and described in U.S. Pat. No. 4,214,364, issued July 29, 1980, in the name of the present assignee.

Several problems arise in lead frames, and their use. Ideally they should be suitable for both hermetic and non-hermetic encapsulation. It would be convenient if the lead frames could be processed with the leads unformed, that is flat and in the same plane as the frame, or with the leads preformed, that is with leg portions bent down. Electroplating is usually carried out on the leg portions. Protection of the chip from electrostatic discharge during processing is important. It is becoming common to surface mount packaged devices on PCBs and in this method, the ends of the leads extending from the package must all touch the PCB for satisfactory connection, by soldering. Even one lead being shorter or longer than datum will prevent acceptable connection. Such accurate positioning is dependent on accurate, precision, forming and cropping. The ability to form the leads while still supported at their ends, and the use of guide surfaces on the lead frame, provides for precision forming and cropping. Eventually reel to reel automated processing is envisaged and the lead frame should be easily and cheaply manufactured.

The present invention provides a lead frame which provides for the above problems. A lead frame in accordance with the present invention has parallel, spaced apart, side members and parallel, spaced apart, transverse members. The transverse members extend between, and connect to, the side members, to define a plurality of areas spaced along the frame. A rectangular die or chip pad is positioned centrally in each area with its sides parallel to the side members and transverse members of the frame. A support lead extends from each corner of the die pad to the corresponding conjunction of side and transverse members. A U-shaped support bar extends between each adjacent pair of support leads, the bar including parallel spaced leg portions connected at inner ends to the support leads, intermediate the ends of the support leads, and connected at outer ends by a lead support portion, the lead support portions parallel to related side and transverse members. A plurality of leads extend from each lead support portion inwards towards the die pad, with inner ends adjacent to but spaced from the die pad.

In a particular embodiment of the invention the outer ends of the support leads are each connected to a lever or arm member extending from a side member or a transverse member to permit expansion of the support leads, with little or no distortion of the support leads. In a further embodiment, the connection between the inner ends of the leg portions and a support lead is arranged to be outside the periphery of a package, for example outside the periphery of a hermetic package having top and bottom ceramic members between which a die is sealed. This provides a single cut position at each support lead on final cutting from the lead frame. The support lead can be narrowed at this position.

The invention will be readily understood by the following description of a particular embodiment, by way of example, in conjunction with the accompanying drawings, in which.

Figure 1:
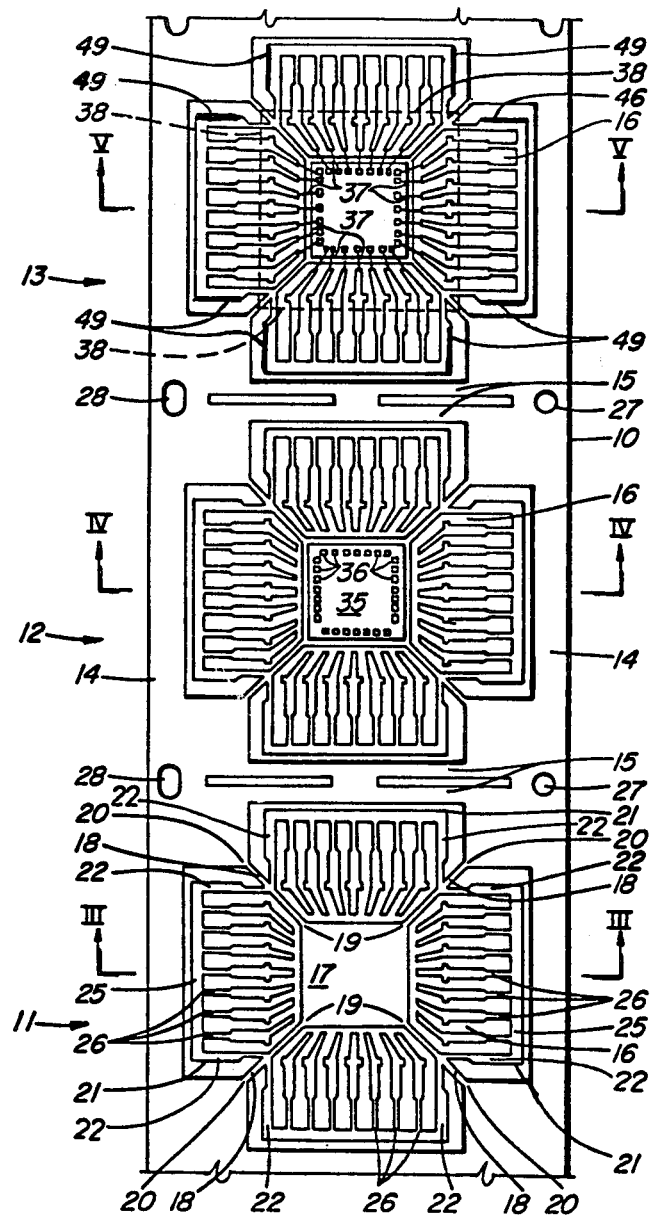
FIG. 1 is a plan view of part of a strip of lead frames, with different process steps illustrated at different frames.

Illustrated in FIG. 1 is a lead frame indicated generally at 10, with three chip or die positions indicated at 11, 12 and 13. The lead frame has parallel, spaced apart, side members 14 and parallel spaced apart transverse members 15. Members 15 extend between and connect to the side members 14 and define areas 16. At a central position of an area, as seen particularly in position 11, is a die chip pad 17, the pad being supported from the frame by support leads 18 extending from each corner 19 of the die pad, to each junction 20 between a side member 14 and transverse members 15.

Extending between each adjacent pair of support leads 18 is a U-shaped support bar 21, having leg portions 22 connected at their inner ends to the support leads 18 and connected at their outer ends by a lead support portion 25. Extending inward from the lead support portions 25 are leads 26. The inner ends of the leads 26 are adjacent to but spaced from the periphery of the die pad 17. Thus it will be seen that the die pad 17 and the leads 26 and support bar 21 are supported from the frame by the support leads 18. Perforations 27 and 28 extend along each side of the frame, one set of perforations, 27, acting as reference or positioning holes to ensure correct positioning of the frame at process stations.

At position 12, a die or chip 35 is seen positioned on the pad 17. The chip is bonded to the pad. On the upper surface of the chip are contact areas 36. At position 13, wire bonding is shown. Wire connections 37 are made between the contact areas 36 and the inner ends of leads 26.

From the position 13, the frame progresses to an encapsulation apparatus. The frame may proceed to the encapsulation without preforming, or the leads 26 may be preformed. The bend or forming line is indicated by the dotted line 38 at position 13 in FIG. 1.

Figure 2:
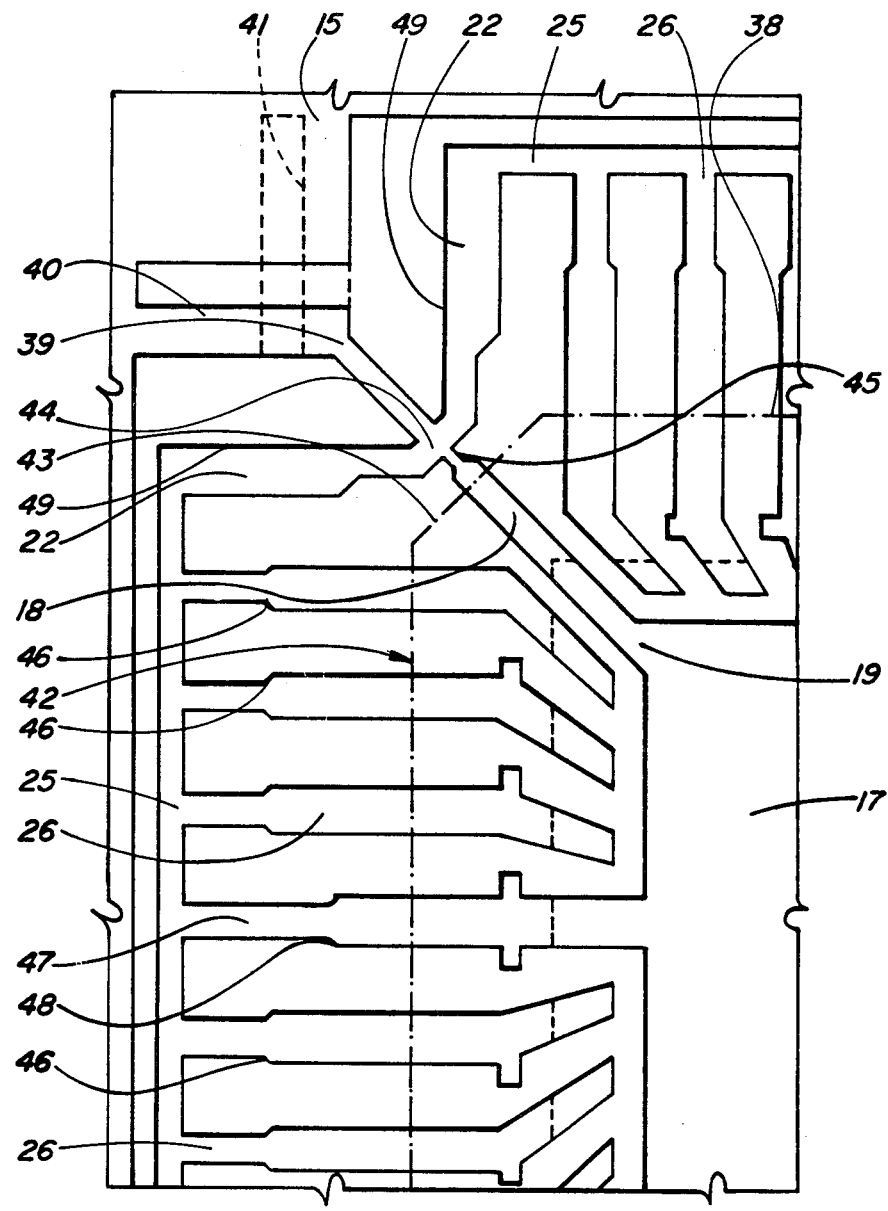
FIG. 2 illustrates a modified form of a lead frame illustrated in FIG. 1.

FIG. 2 illustrates a modification of the lead frame illustrated in FIG. 1, to obviate a problem which can arise. A preferred method of bonding the chip to the pad 17 is by eutectic die bonding. This process involves heating the chip or die, on the pad 17, to over 300° C. This is obtained by heating the pad by contact with a heated block. As a result of this heating, some expansion of the pad, and of support leads 18, occurs. However, the outer part of the lead frame is not heated and does not expand, or expands to a lesser degree. Buckling of the support leads can occur which causes the pad to move out of contact with the heating block. This can cause insufficient heating of the pad 14, and the chip, preventing satisfactory formation of the eutectic bond. The structure as illustrated in FIG. 2 permits expansion of the support leads to occur with substantially no buckling.

In FIG. 2 common references are used for details common with FIG. 1. The drawing is of one corner of a position, showing a junction between a side member 14 and a transverse member 15, to a larger scale for clarity. The support lead 18 connects at its inner end to the corner 10, of the die pad 17. At its outer end, 39, the support lead is connected to an arm, or cantilever, 40 which extends from the side member 14, at the junction. By this arrangement, any expansion of the die pad 17, and the support lead 18 is accommodated by a sideway deflection of the arm 40. Instead of extending from the side member 14, the arm 40 can extend from the transverse member 15, as indicated in dotted outline at 41.

Also illustrated in FIG. 2 is a modification to ease final cutting of a packaged die from a lead frame. Shown on FIG. 2 is the outline of a hermetic package, indicated at 42. Each corner of a package is chamfered, as indicated at 43. This is obtained by making the ceramic top and bottom members with chamfered corners. The inner ends of the legs 22 connect to the support lead, at 44, a short distance outside the package periphery. A necked portion 45 can be formed in the support lead between the connection point 44 and periphery at 43. The necked portion 45 reduces the cutting force required at final cutting of the packaged die from the lead frame.

Also seen in FIG. 2 is a means for identifying a particular pin or lead. It is usual to designate a particular lead as pin number 1. This is to provide orientation of the packaged device. One way of doing this was to provide a narrow rib or slot in the edge of the top or bottom member, or both. However with very high pin counts and very small pitch distances for pins or leads, this is not suitable. It is therefore arranged that the shoulder formed at each side of a lead, indicated generally at 46 in FIG. 2, and which defines a reduced width contact portion 47 on each lead, is moved nearer to the die pad position for one pin or lead. This is indicated at 48.

Figure 3:
FIGS. 3, 4 and 5 are cross-sections on the lines III—III; IV—IV; and V—V respectively on FIG. 1.
Figure 4:
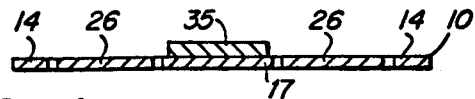
Figure 5:
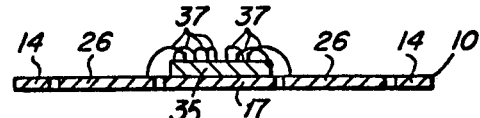
Figure 6:
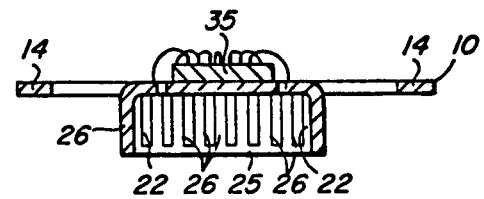
FIG. 6 is a cross-section, similar to that of FIG. 5, but with the leads formed to extend downwards.

FIGS. 3, 4 and 5 illustrate, in cross-section, the lead frame 10 at the various positions 11, 12 and 13 respectively. FIG. 6 shows the leads preformed, as would be the situation if done before encapsulation.

The use of the support leads 18 and support bars 21 provides a number of advantages and overcomes many of the problems hitherto experienced. Thus, for preforming, the leads are still interconnected at their outer ends by the support portion 25. This prevents distortion of individual leads and also ensures that the leads bend down accurately. The outer edges 49 of the legs 22 provide very accurate guide surfaces. These surfaces cooperate with surfaces on the forming tool to give accurate forming and ensure that the leads are bent down vertically, that is each lead is bent down in a plane which is normal to the plane of the lead frame. In normal forming of lead frames it often occurs that leads are bent down non-vertically. With leads on only two opposite sides of a die pad, such non-vertical bending can sometimes be accepted, but with leads on all four sides it is impossible to accommodate such variation on all four sides. Further, on a particular side, some leads may be vertical and others not. This causes a variation in pitch at the ends of the leads with the possibility that the lead ends may not register with contact positions on the circuit board. Further, with surface mounting, it is essential that the bottom ends of the leads be in a common plane.

Also, whether preformed or formed after encapsulation, electroplating of the leads is made much easier by interconnection of the leads. Further, interconnection of the leads provides protection of the chip from electrostatic discharge damage. After manufacture is complete, the lead support portion is trimmed off. However, whether preformed or not, the encapsulated device is still held in the lead frame, but the leads are now electrically isolated from it. Testing of the device can thus be carried out while still in the frame. At the final stage the device is removed from the frame by shearing of the support leads 18.

In many instances it would be convenient, and more economic, to be able to process the frame and attached chip right through encapsulation prior to bending or forming the leads downward. It is easier to traverse a lead frame which is flat, relative to moving such a frame with the leads bent down. Slides are easier to make, and maintain, for a flat strip, whereas for a strip with bent down leads support can mainly only be at the sides of the lead frame. If leads were only on two sides, the lateral sides, no problems occur as grooves can be provided in the sliding surface, but with leads on all sides this cannot be done.

An advantage does occur from preforming, in that the formed leads provide self-jigging or alignment of the ceramic base 50 with the pad 17. Thus, turning the lead frame over, with the attached chip, 35 underneath, a base can simply be dropped down between the leads, and be in alignment. A further member of similar form to a lead frame, with pre-bent or formed leads, forms a holding and locating member for a cap 51. The lead frame with chips and bases is then rested in the holder with the caps and the assembly held together. The assembly is then oven fired to fuse the glass, thus sealing the bases and caps together around the lead frame.

Figure 7A:
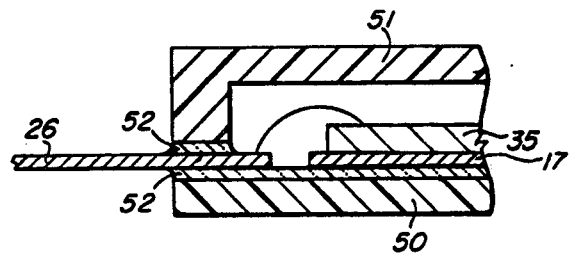
FIGS. 7a, 7b and 7c are diagrammatic partial cross-sections through one form of hermetic encapsulation, illustrating a problem therewith.
Figure 7B:
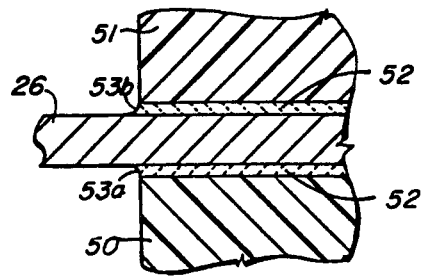
Figure 7C:
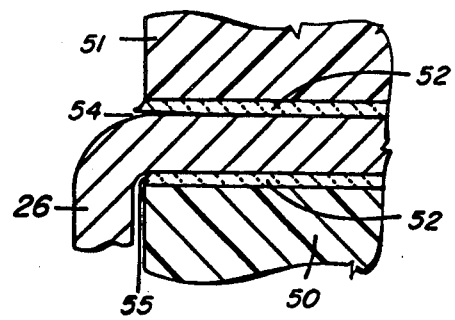

Bending after encapsulation can cause problems. In one encapsulation process, for example, the chip is hermetically encapsulated by being enclosed between two housings, for example of ceramic, which are sealed together by fused glass. Due to the brittle nature of the seal, leads are either preformed before sealing, or the leads are clamped at a position between the seals and the desired bending point. However, the latter method increases the overall size of the package. The problem is illustrated in FIGS. 7a, 7b and 7c. In FIG. 7a, the chip 35 is mounted on the base 50, with a cap 51, of the same external dimensions as the base resting over the base and chip. Prior to assembly glass exists on the base and around the periphery of the cap. After attachment of the chip 35, to the pad 17 and attachment of chip pad 17 to the base 50, the cap 51 is positioned on the base. Heating of the assembly causes the glass to melt and fuse, sealing the cap and base together and also sealing around the leads 26. This is indicated at 52 in FIG. 7a, and seen enlarged in FIG. 7b. It will be seen that a glass meniscus 53a and 53b extends between base 50 and leads 26, and between cap 51 and the leads 26 respectively. If the leads are then bent or formed, as in FIG. 7c an incipient crack can form, on the top of the lead, at 54, and chipping occurs at the bottom or underside of the lead, at 55. This can lead to the eventual failure of the seal.

If the leads are clamped external to the base and cap, the lead being bent down outside the clamps, the above problems can be avoided but the extra room for the clamps, typically 0.035" between seal and bend, increases the area occupied by the finished package.

Figure 8A:
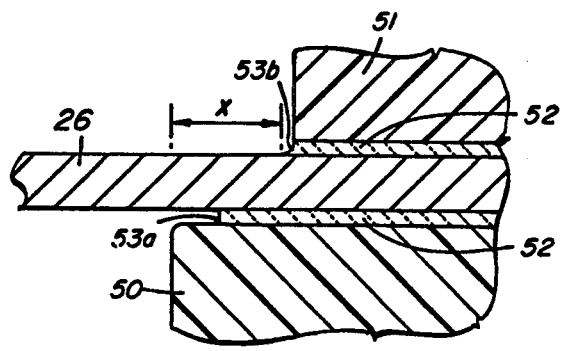
FIGS. 8a and 8b are similar partial cross-sections, with an alternative design which overcomes the problem illustrated in FIG. 6.
Figure 8B:
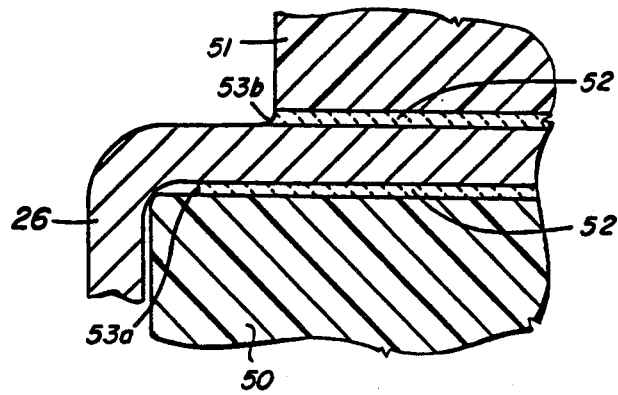

FIGS. 8a and 8b illustrate a way of overcoming this problem. The cap 51 is made smaller than the base 50. The glass on the base is moved inward slightly and when cap and base are sealed together the meniscus 53b on the top of the lead is spaced inward from the periphery of the base. Typically this distance, X, should be about 1½ to 2 times the lead thickness. The meniscus 53a at the underside of the lead does not reach to the periphery of the base. This is illustrated in FIG. 8a. FIG. 8b illustrates the situation after bending of the leads. The top meniscus 53b is unaffected by the bending and similarly the bending does not affect the lower meniscus 53a either. This would enable post-encapsulation bending of the leads and facilitate processing of lead frames, particularly reel to reel processing.

While the invention has been described in relation to encapsulation of the type in which the chip is hermetically sealed between glass or ceramic bases and caps, the invention can also be used for plastic encapsulation, where the chip and chip pad are encapsulated by molding of plastic material, for example a synthetic resin around the chip, chip pad, and inner ends of the leads and the wire bonding between chip and leads.

What is claimed is:

1. A lead frame for leaded semiconductor chip carriers, said lead frame comprising:
   two parallel spaced apart side members;
   a plurality of parallel transverse members extending between and normal to the side members and connected thereto to define a plurality of areas spaced along the lead frame;
   a rectangular chip pad positioned centrally in each area, the chip pad having sides parallel to the side members and the transverse members;
   a support lead extending from each corner of the chip pad to a junction of a side member and a transverse member, each of the junctions including a cantilever arm extending from one of said side members and said transverse members, substantially normal thereto, each cantilever arm having an inner free end, each support lead being connected at an outer end to an inner free end of an arm;
   a U-shaped support bar extending between each adjacent pair of support leads, the support bar including spaced parallel leg portions each connected at an outer end by a lead support portion, the lead support portions being parallel to related side and transverse members, the leg portions each being connected at an inner end to a support lead at a position intermediate the ends of the support leads; and
   a plurality of leads extending from each lead support portion inwards towards the chip pad, the leads having inner ends adjacent to but spaced from the chip pad.

2. A lead frame as claimed in claim 1, each support lead including a portion of reduced width at a position immediately inward of the position of connection between said leg portions of said support bar and the support lead, said portion of reduced width being outward of a line defining the periphery of the package, when lead frame and chip are encapsulated.

3. A lead frame as claimed in claim 1, each of said leads extending inward from each lead support portion including a portion of reduced width extending inward from said support lead portion and a shoulder defining the inner end of said portion of reduced width, said shoulder for a predetermined one of said leads being positioned further inward from said lead support portion than the remainder of said leads.

4. A lead frame as claimed in claim 1, including guide edges on the outer edges of the leg portions of said support bar, said guide edges adapted for enagement with guide members on a bending apparatus, to ensure correct bending of said leads.

5. A lead frame as claimed in claim 1, including perforations along each side, for positioning of said areas at predetermined positions.

6. A lead frame as claimed in claim 1, including a semiconductor chip mounted on said chip pad.

7. A lead frame as claimed in claim 6, said chip including a plurality of contact areas on an upper surface, and wire bonds extending from the inner ends of the leads to the contact areas. pg,15

8. A lead frame as claimed in claim 7, wherein said chip, chip pad and inner ends of said leads are encapsulated.

9. A lead frame as claimed in claim 8, wherein said chip, chip pad and inner ends of said leads are sealed between a base and a cap.

10. A lead frame as claimed in claim 6, wherein said leads and said support bar are preformed, whereby said leads extend downward normal to the plane of the lead frame, in a direction away from said chip.

11. A lead frame as claimed in claim 1, including lateral projections on said leads, spaced from the inner ends of the leads.

* * * * *